(12) United States Patent
Kunz et al.

(10) Patent No.: US 6,320,399 B1
(45) Date of Patent: Nov. 20, 2001

(54) MEASURING METHOD FOR DETECTING A SHORT-CIRCUIT BETWEEN THE TURNS OF A COIL INTEGRATED ON A CHIP, AND INTEGRATED CIRCUIT STRUCTURE ADAPTED TO SUCH A MEASURING METHOD

(75) Inventors: Pascal Kunz; Antal Banyai, both of Neuchâtel (CH)

(73) Assignee: EM Microelectronic-Marin SA, Marin (CH)

( * ) Notice: Subject to any disclaimer, the term of this patent is extended or adjusted under 35 U.S.C. 154(b) by 0 days.

(21) Appl. No.: 09/044,947

(22) Filed: Mar. 20, 1998

(30) Foreign Application Priority Data

Mar. 24, 1997 (CH) .................................................. 0701 97

(51) Int. Cl.⁷ .................................................. G01R 31/26
(52) U.S. Cl. .......................................... 324/765; 324/525
(58) Field of Search ................................ 324/522, 523, 324/524, 525, 527, 537, 546, 543, 704, 555, 539, 765

(56) References Cited

U.S. PATENT DOCUMENTS

| | | | |
|---|---|---|---|
| 4,175,253 | * 11/1979 | Piteoff | 324/704 |
| 4,176,313 | * 11/1979 | Wrinn | 324/704 |
| 4,835,466 | * 5/1989 | Maly et al. | 324/537 |
| 5,307,019 | * 4/1994 | Robey et al. | 324/704 |
| 5,670,891 | * 9/1997 | Ling et al. | 324/765 |

FOREIGN PATENT DOCUMENTS

| | | |
|---|---|---|
| 11 78 938 B | 10/1964 | (DE) . |
| 0 655 628 A2 | 5/1995 | (EP) . |
| 0 867 726 A1 | * 9/1998 | (EP) . |
| 10-274668 | * 7/1997 | (JP) . |
| WO 88/00785 | 1/1988 | (WO) . |

OTHER PUBLICATIONS

Technical Digest—Western Electric, No. 36 Oct. 1974, New York US, pp. 23–24, XP002039215 Mila: "Testing Twisted Pairs For Opens, Short . . . ".

* cited by examiner

Primary Examiner—Safet Metjahic
Assistant Examiner—Vincent Q. Nguyen
(74) Attorney, Agent, or Firm—Griffin & Szipl, P.C.

(57) ABSTRACT

The present invention concerns a method for measuring a chip integrated structure (1) including at least one coil (5) having a plurality of turns (6). The present invention is characterized on the following steps: measuring the resistance across the terminals of first and second portions of said coil (5), corresponding to two different numbers of turns of the coil; computing the ratio of the measured resistances across the terminals of first and second portions of the coil (5); comparing the ratio to a constant measured from a sample of resistance measurements made on coils of identical geometry; and determining the presence or the absence of a short circuit between at least two turns of one of said portions of said coil (5), when the ratio is different from or equal to said constant respectively. The present invention further concerns an integrated circuit which is able to allow implementation of the above mentioned measuring method.

5 Claims, 1 Drawing Sheet

MEASURING METHOD FOR DETECTING A SHORT-CIRCUIT BETWEEN THE TURNS OF A COIL INTEGRATED ON A CHIP, AND INTEGRATED CIRCUIT STRUCTURE ADAPTED TO SUCH A MEASURING METHOD

The present invention concerns a chip integrated circuit measuring method and, more particularly, a measuring method for detecting a short-circuit between two turns of a coil integrated on a chip, and an integrated circuit structure adapted to such a measuring method.

BACKGROUND OF THE INVENTION

Coils are currently used in integrated circuit structures. By way of example, WO 88/00785 discloses a transponder device 1 formed in a substrate 2 and essentially comprising a coil 5 formed of several turns 6. By way of illustration, this structure further includes various integrated circuits 3, 4.

A problem encountered in such structures lies in the fact that short-circuits may occur between two turns of such a coil during a subsequent step in the course of manufacture of the integrated structures. This may disturb, in particular, the operation of the coil, and may be particularly inconvenient in the event that the number of coil turns or the inductance of the coil are important parameters for certain applications, such as the use of the coil as a transponder antenna.

SUMMARY OF THE INVENTION

An object of the present invention is to provide a measuring method for detecting a short-circuit between two turns of a coil integrated on a chip, to avoid disturbances in the operation of said coil.

Another object of the present invention is to provide a measuring method which answers conventional industrial criteria, of cost, simplicity and speed of implementation.

These objects, in addition to others, are achieved thanks to a method for measuring a chip integrated structure including at least one coil comprising a plurality of turns, said method being characterised in that it comprises the following steps: measuring the resistance across the terminals of first and second portions of said coil, corresponding to two different numbers of turns of the coil; computing the ratio of the measured resistances across the terminals of first and second portions of said coil; comparing said ratio to a constant measured from a sample of resistance measurements made on coils of identical geometry; and determining the presence or the absence of a short circuit between at least two turns of one of said portions of said coil, when the ratio is different from or equal to said constant respectively.

An advantage of the present invention is to provide a measuring method which does not require use of specific equipment, which makes this method inexpensive.

Another advantage of the present invention is to provide a method essentially based on two resistance measurements, which makes this method simple and quick.

Another advantage of the present invention is to provide a method which does not depend upon variable technological or environmental type parameters, which makes this measuring method particularly reliable and accurate.

Another object of the present invention is to provide an integrated circuit structure adapted to the measuring method according to the present invention.

Another object of the present invention is to provide an integrated circuit structure of this type which answers conventional industrial criteria of cost, simplicity and speed of implementation.

These objects, in addition to others, are achieved by an integrated circuit structure including at least one coil comprising a plurality of turns, said structure being characterised in that said coil further comprises contact pads integral to said turns, and able to allow implementation of the above defined measuring method.

An advantage of the present invention is to provide an integrated circuit structure of the same complexity as conventional structures, which does not require additional manufacturing steps.

BRIEF DESCRIPTION OF THE DRAWINGS

The objects, features and advantages of the present invention, will appear more clearly upon reading the detailed description of a preferred embodiment of the invention, given solely by way of example, in relation to the annexed drawings, in which.

DESCRIPTION OF THE PREFERRED EMBODIMENTS

Figure 2:
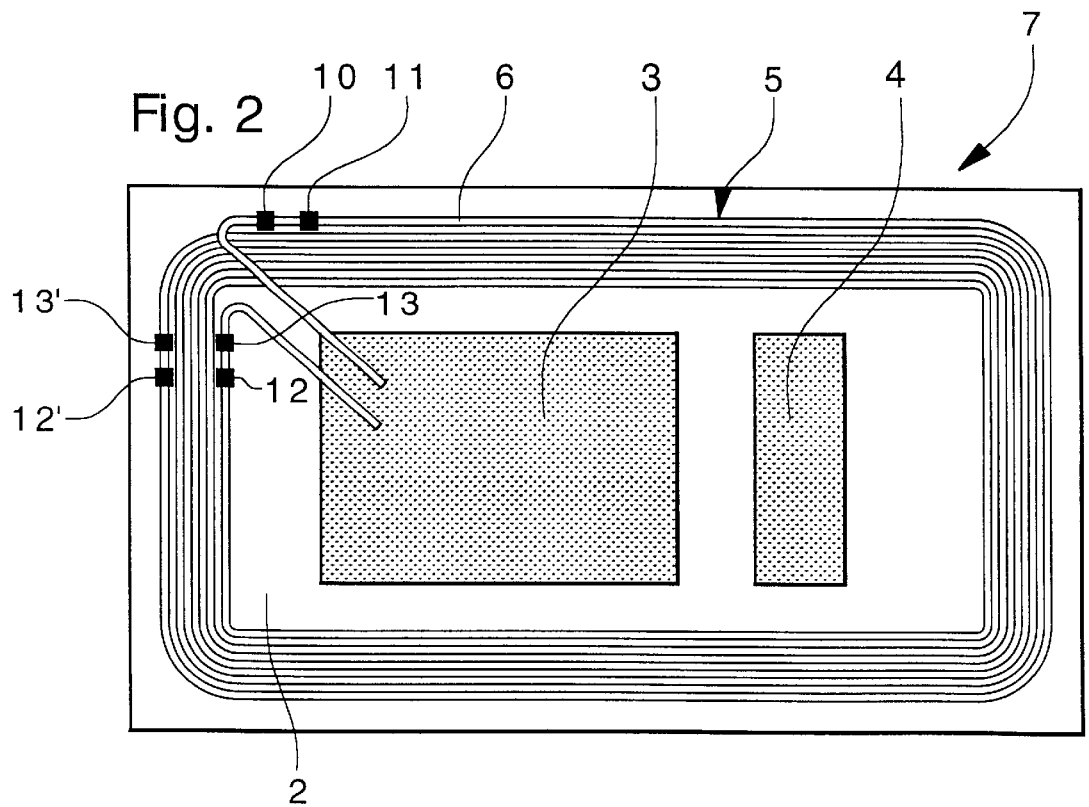
FIG. 2 shows an example of an integrated circuit structure adapted to the implementation of the measuring method according to the present invention.

FIG. 2 shows an example of an integrated circuit structure according to the present invention.

Figure 1:
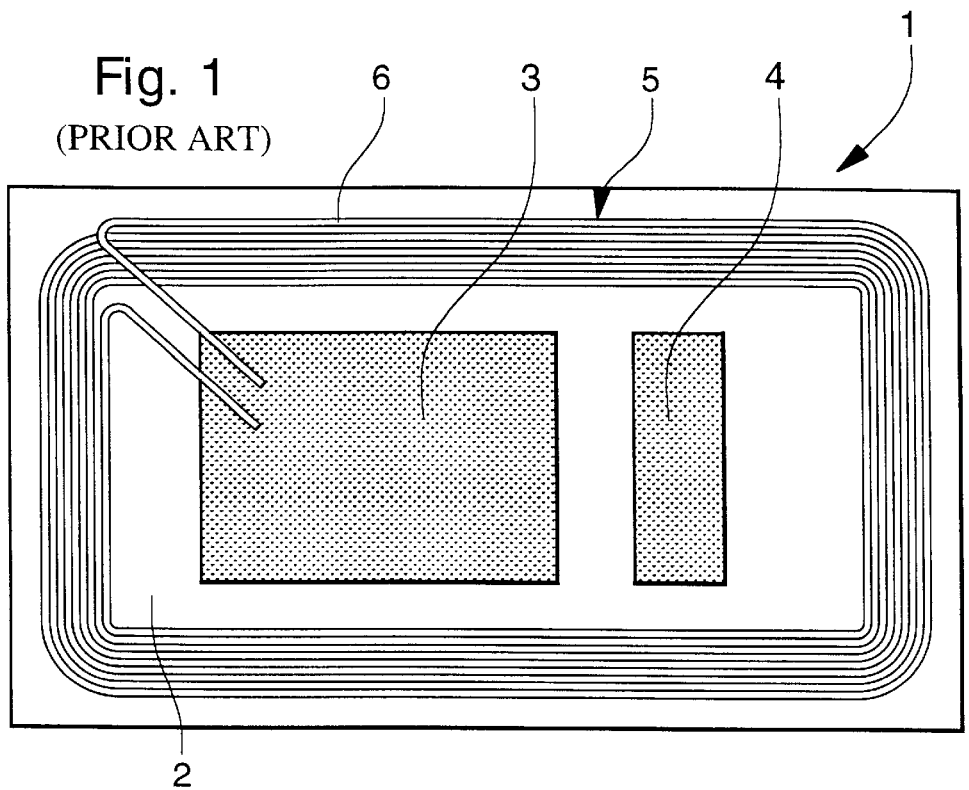
FIG. 1 which has already been referred to, shows a conventional integrated circuit structure including a multiple turn coil.

An integrated circuit structure 7 shown in FIG. 2 is close to the integrated circuit structure described hereinbefore in relation to FIG. 1. Thus, for reasons of simplicity, the components shown in FIG. 2 and designated by the same references as those shown in FIG. 1 are substantially identical to those designated in FIG. 1.

Integrated circuit structure 7 formed in a monolithic manner in a substrate 2 is made up of various integrated circuit elements 3, 4 and a coil antenna 5 formed by several conductive turns 6.

Integrated circuit structure 7 further includes contact pads 10, 11, 12, 13, 12' and 13' formed on turns 6 of coil 5, so that contact pads 10, 13 and 13' are situated respectively in the vicinity of contact pads 11, 12 and 12', as is shown in FIG. 2. The man skilled in the art will note that these contact pads may easily be made by manufacturing methods known within the art, which do not present any particular difficulties as regards the structure of coil 5, and the making thereof.

Contact pads 10, 11, 12, 13, 12' and 13' are intended to make the contact between coil 5 and each of the four tips or prods of a measuring machine commonly used to make measurements of electric parameters on integrated circuit structures.

The operation of such a test machine is assumed to be known by the man skilled in the art, and will thus not be explained in a detailed manner in the following description. Essentially, the operating principle of such a machine is as follows. A current is supplied locally to coil 5, by the tip placed on contact pad 10. This current is received by a second tip placed on contact pad 13. Thus, said current passes through a certain number of turns, this number being predetermined and equal to the number of coil turns comprised between contact pads 10 and 13. Simultaneously, the third and fourth tips placed on contact pads 11 and 12 are situated by definition in the vicinity of tips 10 and 13 respectively and are intended to measure the voltage across tips 11 and 12, said measurement being made by a high impedance voltage measuring apparatus. Since tips 10 and 13 are respectively in the vicinity of tips 11 and 12, the current and voltage across the terminals of the predetermined number of coil turns is thus known, and the resistance of a predetermined number of turns is thus also known. An advantage of a resistance measurement on such a test machine is providing resistance measurements independent of the contacts between the tips of said machine and the respective contact pads.

By way of example, FIG. 2 shows contact pads 10, 11, 12, 13, 12' and 13' corresponding to two different resistance measurements: a first resistance measurement R1 of the whole of coil 5, and a second resistance measurement R2 of a part of coil 5. It goes without saying that the choice of the number of turns measured during the second measurement, as is shown in FIG. 2, is purely illustrative, and is given solely by way of example.

When there no short-circuit occurs between two turns, the value of the ratio R1/R2 between the two previously measured measurements R1 and R2 is equal to a constant C. Furthermore, constant C may be computed from a set of resistance measurements on other devices including a coil of the identical geometry, or constant C may be determined theoretically according to the geometry of the coil.

Conversely, if a short-circuit occurs between at least two turns of the coil, the value of the ratio R1/R2 between the two resistance measurements R1 and R2 differs significantly from said constant C. Indeed, if a short-circuit occurs between two turns of coil 5, the portion of coil including these two short-circuited turns has a resistance markedly less than the resistance of the same portion of coil without any short-circuited turns.

By a series of two measurements on a coil of an adapted integrated circuit structure, i.e. of the type shown in FIG. 2, it can thus be detected whether at least two turns have short-circuited in the said coil.

It goes without saying for the man skilled in the art that the detailed description hereinbefore may undergo various modifications without departing from the scope of the present invention.

What is claimed is:

1. A measuring method of an integrated circuit structure including at least one coil comprising a plurality of turns for detecting a short-circuit between turns of said coil, wherein said method comprises the following steps:

measuring a first and a second resistance across first and second portions of said coil, corresponding to two different numbers of turns of the coil, via contact pads integral with said turns on the first and second portions and four tips of a resistance measuring machine;

computing the ratio of said first and second resistances measured across the terminals of first and second portions of said coil;

comparing said ratio to a constant corresponding to a ratio of resistance measurements made on coils of identical geometry; and determining the presence or the absence of a short circuit between at least two turns of one of said portions of said coil, when the ratio is different from or respectively equal to said constant.

2. An integrated circuit structure including at least one coil comprising a plurality of turns, wherein said coil further includes contact pads integral with said turns, said contact pads being terminals of first and second portions of said coil corresponding to two different number of turns of the coil.

3. The integrated circuit structure according to claim 2, wherein the first portion of said coil includes all turns of said coil, and wherein the second portion of said coil includes one turn of said coil.

4. The integrated circuit structure according to claim 2, wherein it defines a transponder.

5. A measuring method of an integrated circuit structure including at least one coil comprising a plurality of turns for detecting a short-circuit between turns of said coil, said structure defining a transponder, wherein said method comprises the following steps:

measuring a first and a second resistance across the terminals of first and second portions of said coil, corresponding to two different numbers of turns of the coil;

computing the ratio of said first and second resistances measured across the terminals of first and second portions of said coil;

comparing said ratio to a constant corresponding to a ratio of resistance measurements made on coils of identical geometry; and determining the presence or the absence of a short circuit between at least two turns of one of said portions of said coil, when the ratio is different from or respectively equal to said constant.

* * * * *